US008924811B1

(12) United States Patent
Ghosh

(10) Patent No.: US 8,924,811 B1
(45) Date of Patent: Dec. 30, 2014

(54) FAST, EFFICIENT ARCHITECTURES FOR INNER AND OUTER DECODERS FOR SERIAL CONCATENATED CONVOLUTIONAL CODES

(75) Inventor: Sagnik Ghosh, La Jolla, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 971 days.

(21) Appl. No.: 12/657,018

(22) Filed: Jan. 12, 2010

(51) Int. Cl.
*H03M 13/00* (2006.01)

(52) U.S. Cl.
USPC ........................................................ 714/755

(58) Field of Classification Search
CPC . H03M 13/09; H03M 13/3994; H03M 13/15; H03M 13/258; H03M 13/2936; H03M 13/2948; H03M 13/3776; H03M 13/3905; H03M 13/2957; H03M 13/2975; H03M 13/3961; H03M 13/3972
USPC ......................................................... 714/755
See application file for complete search history.

(56) References Cited

U.S. PATENT DOCUMENTS

| | | | | |
|---|---|---|---|---|
| 5,181,209 | A * | 1/1993 | Hagenauer et al. | 714/795 |
| 5,408,502 | A * | 4/1995 | How | 375/340 |
| 5,414,738 | A * | 5/1995 | Bienz | 375/341 |
| 5,721,746 | A * | 2/1998 | Hladik et al. | 714/792 |
| 5,734,962 | A * | 3/1998 | Hladik et al. | 455/12.1 |
| 5,742,622 | A * | 4/1998 | Claydon et al. | 714/789 |
| 6,154,871 | A * | 11/2000 | Claydon et al. | 714/795 |
| 6,563,877 | B1 * | 5/2003 | Abbaszadeh | 375/242 |
| 6,973,615 | B1 * | 12/2005 | Arad et al. | 714/792 |
| 7,243,294 | B1 * | 7/2007 | Divsalar et al. | 714/792 |
| 2001/0025358 | A1 * | 9/2001 | Eidson et al. | 714/752 |
| 2002/0034261 | A1 * | 3/2002 | Eidson et al. | 375/298 |
| 2002/0095640 | A1 * | 7/2002 | Arad et al. | 714/792 |
| 2003/0028838 | A1 * | 2/2003 | Chang et al. | 714/755 |
| 2004/0123217 | A1 * | 6/2004 | Rhee et al. | 714/755 |
| 2004/0261002 | A1 * | 12/2004 | Eidson et al. | 714/786 |
| 2007/0130494 | A1 * | 6/2007 | Divsalar et al. | 714/755 |

(Continued)

OTHER PUBLICATIONS

"A Soft-Input Soft-Output Maximum A Posteriori (MAP) Module to Decode Parallel and Serial Concatenated Codes," Benedetto et al. TDA Progress Report 24-27, Nov. 15, 1996.

*Primary Examiner* — Amine Riad
(74) *Attorney, Agent, or Firm* — Oblon, Spivak, McClelland, Maier & Neustadt, L.L.P.

(57) ABSTRACT

Disclosed is a decoder having efficient inner and outer decoders for decoding serially concatenated convolutional codes. The decoder comprises a data converter that processes soft demodulator data derived from a demodulator to generate log of probabilities data. An inner decoder is coupled to the data converter and comprises a forward recursion metric in parallel with a backward recursion metric that are coupled to a soft log-likelihood calculation processor and that generate inner decoded soft data. A de-interleaver is coupled to the inner decoder that de-interleaves the inner decoded soft data. An outer decoder is coupled to the de-interleaver that comprises a forward recursion metric in parallel with a backward recursion metric that are coupled to a soft log-likelihood calculation processor that generate outer decoded soft data. An interleaver feeds back the outer decoded soft data to the inner decoder. A decision processor processes the outer-coded soft data to generate decoded data. The inner and outer decoders may each normalize the largest state recursion metric to 0, and subtract off the original largest value from the rest of the recursion metrics. The soft log-likelihood calculation processor in the inner and outer decoders preferably comprises add and compare operators.

16 Claims, 4 Drawing Sheets

(56) References Cited

U.S. PATENT DOCUMENTS

| | | |
|---|---|---|
| 2007/0229344 A1* | 10/2007 | Meyer et al. ................ 341/161 |
| 2008/0072123 A1* | 3/2008 | Eidson et al. ................ 714/786 |
| 2010/0299581 A1* | 11/2010 | Divsalar et al. ................ 714/786 |
| 2012/0042228 A1* | 2/2012 | Hekstra et al. ................ 714/784 |
| 2012/0069936 A1* | 3/2012 | Shaver et al. ................ 375/340 |

* cited by examiner

FAST, EFFICIENT ARCHITECTURES FOR INNER AND OUTER DECODERS FOR SERIAL CONCATENATED CONVOLUTIONAL CODES

BACKGROUND

The present invention relates generally to decoding architectures, and more particularly to fast, efficient architectures for inner and outer decoders that decode serially concatenated convolutional codes.

Digital communication systems employ coding for reliable data transmission over a noisy channel. This coding, while increasing reliability, forces the transmission data rate down. Claude Shannon, the founder of information theory, came up with bounds for the maximum rate that can be achieved when coding data while still maintaining reliable communication. Since then, much research has been done to achieve the bounds set out by Shannon's theory. One class of codes that comes very close to achieving Shannon's bound is turbo codes.

Turbo codes, conceived in 1993, have over time been split into two classes of codes: parallel concatenated convolutional codes (PCCC's) and serial concatenated convolutional codes (SCCC's). While both of these codes give excellent performance in terms of reliability, decoding such codes at the receiver proves to be a constant bottleneck in communication systems today, since these are very complex codes. Often, decoding of these codes also employs iterative techniques to lower the bit error rate (BER). Thus, speed is imperative when designing the decoder.

Algorithms using lookup tables and lower performance metrics have been conventionally used for SCCC decoder blocks. Examples of such algorithms are the well-known MAP algorithm and a less sophisticated Log-Max-MAP algorithm. Normalization is also a big problem in the state metric computation step, which can require significant computational complexity.

A paper "A Soft-Input Soft-Output Maximum A Posteriori (MAP) Module to Decode Parallel and Serial Concatenated Codes" by Benedetto et al. TDA Progress Report 24-27, Nov. 15, 1996 discloses a generalized SCCC decoder. The present invention improves upon this decoder design.

It would be desirable to have fast, efficient architectures for inner and outer decoders for use with serially concatenated convolutional codes. It would be desirable to have an improved architecture for inner and outer decoder blocks of an SCCC decoder that employs a Log-Max-MAP algorithm in a very efficient manner. It would be desirable to have an improved architecture for inner and outer decoder blocks that uses only add and compare operations, thus eliminating the need for lookup tables.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 3:
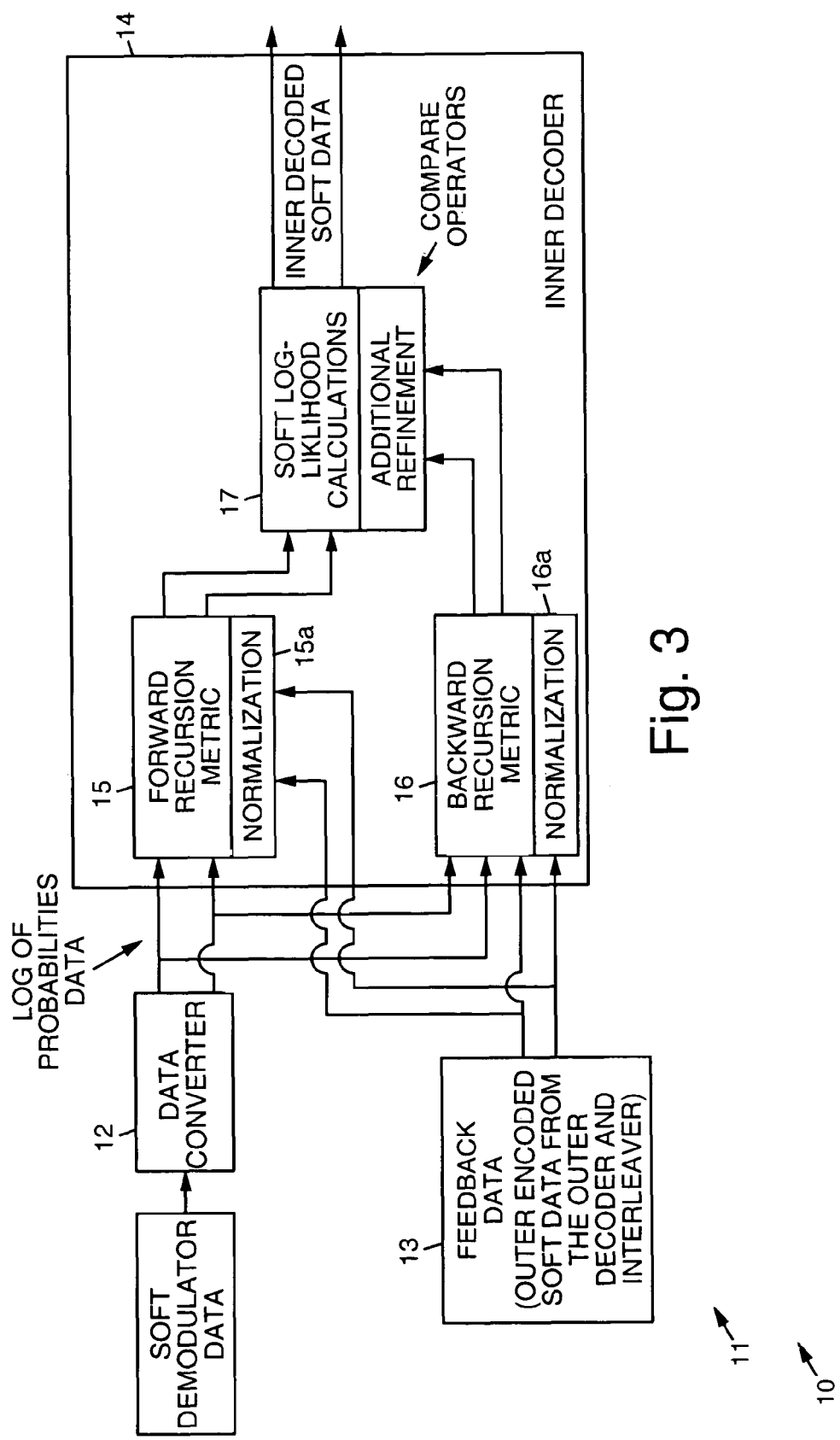
FIG. 3 illustrates an exemplary serial concatenated convolutional code inner decoder.
Figure 4:
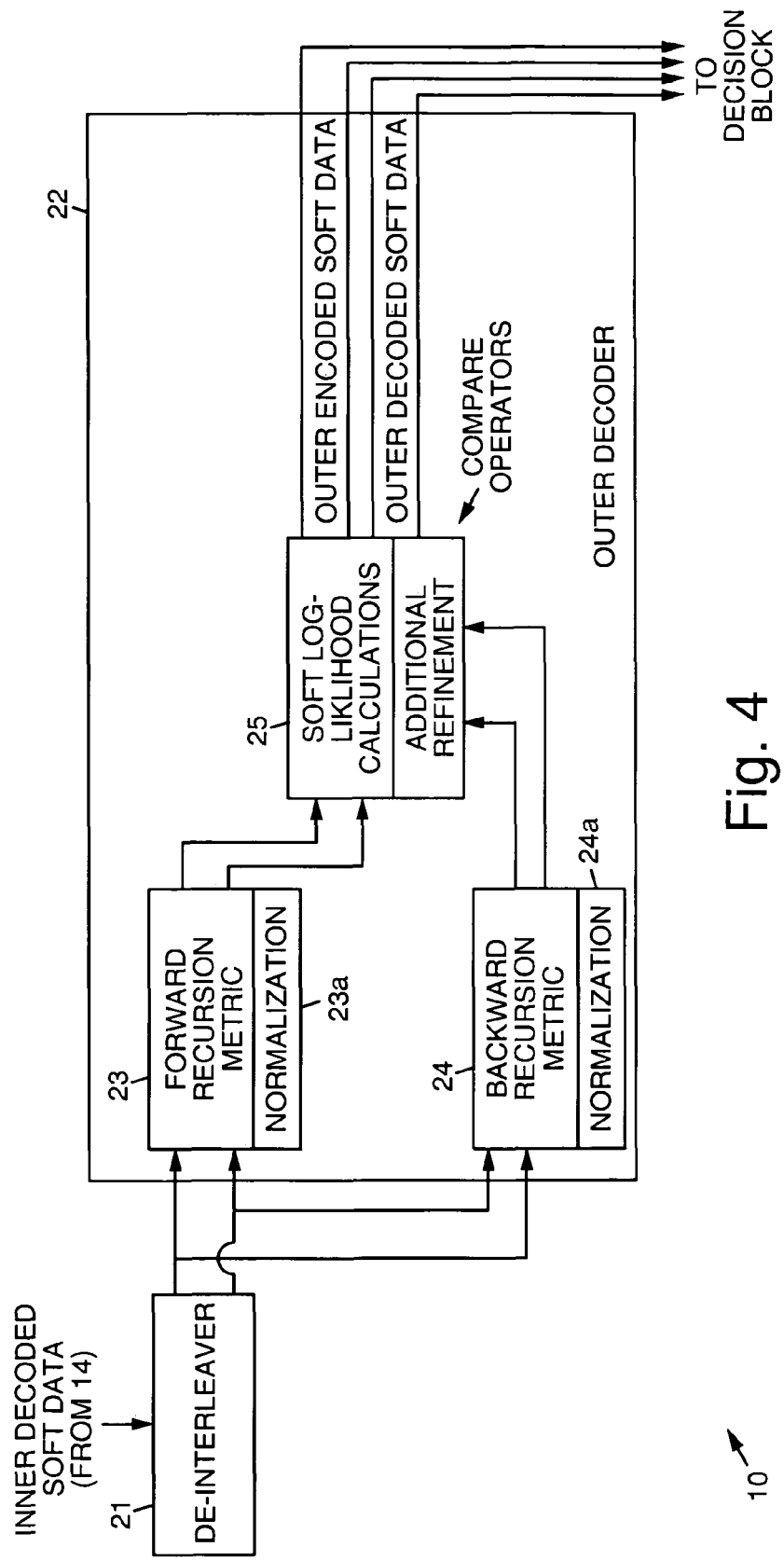
FIG. 4 illustrates an exemplary serial concatenated convolutional code outer decoder.

Disclosed are exemplary fast, efficient architectures for inner and outer decoders for decoding serially concatenated convolutional codes. FIG. 3 illustrates an exemplary improved serial concatenated convolutional code encoder 10. FIG. 4 illustrates an exemplary improved serial concatenated convolutional code decoder 20.

The design of the decoder 10 improves upon on the generalized decoder disclosed in the paper entitled "A Soft-Input Soft-Output Maximum A Posteriori (MAP) Module to Decode Parallel and Serial Concatenated Codes" by Benedetto et al. The design presented herein streamlines the Benedetto et al. decoder for use with a Log-Max-MAP algorithm and adds processing to further increase performance, including an improved format for input and output data that increases efficiency.

The mechanism for converting the data to the appropriate input data is described below, and the problem with normalization of state metrics is solved in an efficient manner in the present decoder 10. The design of the exemplary decoder 10 employs only add and compare operators (no look-up tables required), fully specified for an arbitrary SCCC code. The requirement in the present decoder 10 is that the data converter block must receive soft data inputs and output two log-likelihood values per soft input (one for probability of the bit being 1, one for the probability of the bit being 0). This operation involves log and exponent calculations, and is the only portion that may require lookup tables or time-consuming calculations. However, this step only needs to be computed once for a SCCC block (it is not part of the iterative decoding), and it does not significantly affect throughput of the design.

Concerns relating to additional memory requirements resulting from the use of two log-likelihood values as opposed to the one log-likelihood ratio (which can also capture the information sufficiently) are addressed. First of all, this does not necessarily double the amount of memory necessary, since coarser quantization on the two individual values may be used. In addition, using two values, as opposed to one, provides for significantly increased speed since these values are extracted anyway using either lookup tables or time-consuming calculations at the beginning of each iteration (since these calculations require log and exp operations).

The solution disclosed herein avoids using lookup tables and configures the decoder 10 using simple sum and compare operations, which can be done very fast in hardware. This comes at the cost of no performance loss, although the amount of memory required may need to be increased (the number of values required doubles, but the quantization required per value is decreased). In addition, the BER performance of the decoder 10 is enhanced using a final algorithm step with minimal increases in computation complexity over typical Log-Max-MAP algorithms. A novel, computationally simple normalization step is also employed in the decoder 10.

Figure 1:
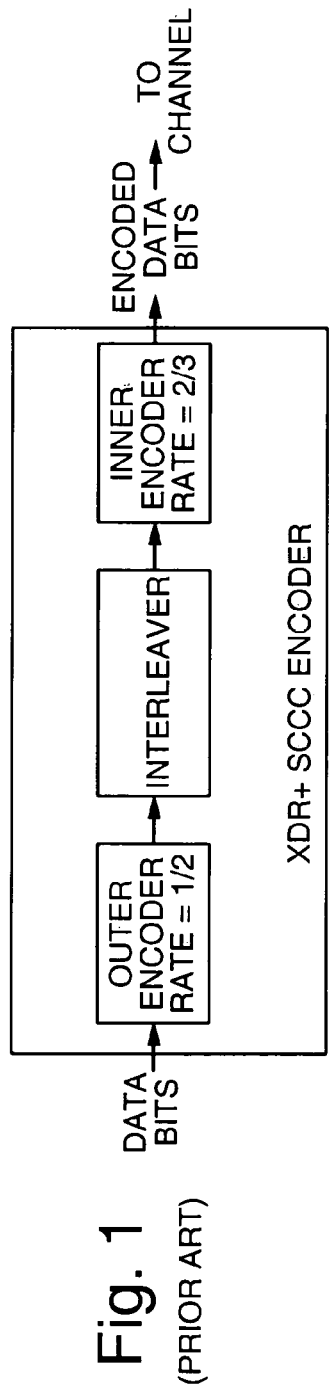
FIG. 1 illustrates a conventional XDR+ serial concatenated convolutional code encoder.

Referring to the drawing figures, a block diagram of a conventional XDR+SCCC encoder is shown in FIG. 1. Turbo encoders, such as the XDR+SCCC encoder is shown in FIG. 1 consist of two encoders and an interleaver. Serial concatenated convolutional codes (SCCCs), in particular, take the input into the encoder, which is referred to as data bits. The data bits are encoded in "packets." For an XDR+ waveform, for example, the rate ½ code in the specification (which has been used in tests of a reduced-to-practice decoder 10) takes in 2304 data bits and outputs 4608 encoded bits. The 2304 data bits comprise one data packet while the 4608 encoded bits comprise one encoded packet. While this is what the XDR+ waveform uses, the decoder 10 is not specific to this code, but can be used for any serial concatenated convolutional code.

The first step in the algorithm implemented in the decoder shown in FIG. 1 is to encode a data packet using an "outer code." The result of the outer code is then sent through an interleaver, and the result from the interleaver is then sent through an "inner code." The output of the inner code contains the bits to be modulated, up-converted, and sent across a communications channel.

In the downlink, a terminal receives the noisy signal through its front-end, down-converts the signal, and demodulates the signal to produce a noisy encoded bit stream. For many codes, the information from the demodulator is an estimate of the bits based on some threshold criteria (for example, in BPSK, a 0 is sent at a high voltage and a 1 is sent at a low voltage). If the incoming sample at the demodulator is closer to the high voltage than to the low voltage, the demodulator sends a 0 to the decoder; otherwise, the demodulator sends a 1 to the decoder). Decoders that use this kind of information are known as hard decision decoders.

Typical turbo decoders, however, differ from hard decision decoders, and use soft information about the bits in an iterative process. Instead of taking a bit estimate from the demodulator, a turbo decoder uses the probabilities of the bit being either a 0 or 1 and the probabilities about surrounding bits in the stream to make its decision. Furthermore, since there are two codes involved, the process can be used iteratively to refine the information based on the structure of the codes to get a final estimate on the data bits. The iterative process is illustrated in FIG. 2, which shows a basic iterative conventional serial concatenated convolutional code decoder.

Figure 2:
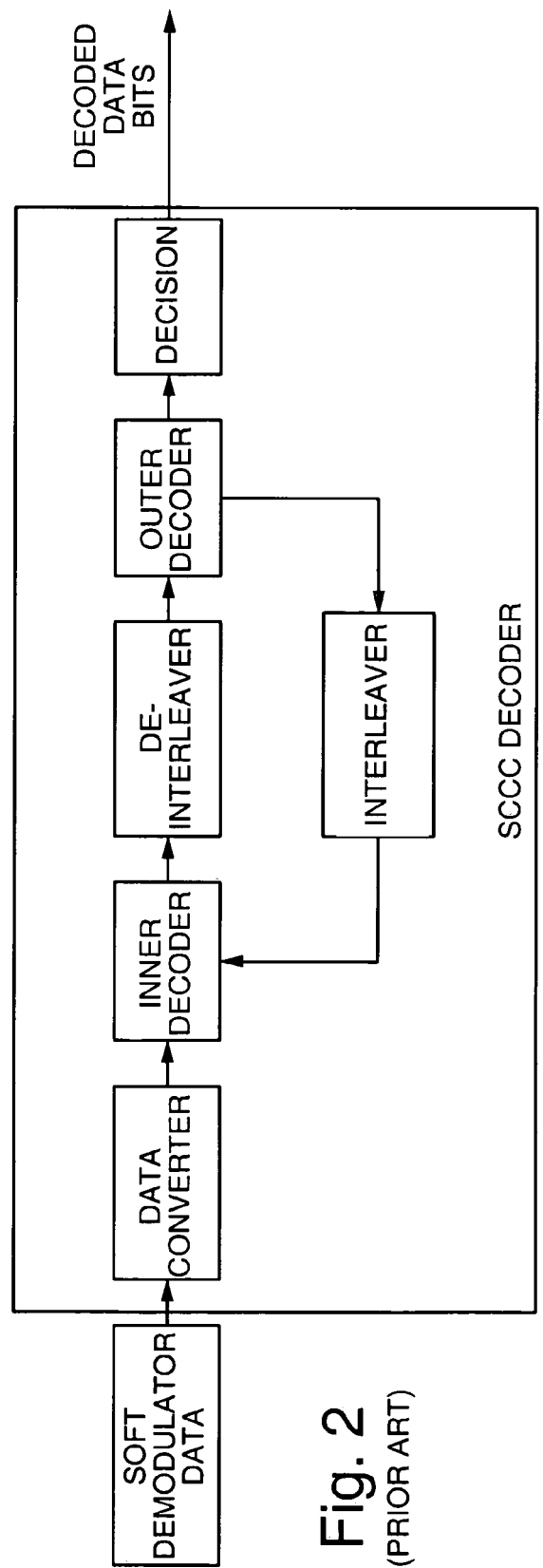
FIG. 2 illustrates a conventional serial concatenated convolutional code decoder.

As is illustrated in FIG. 2, the decoder operates as follows: first, soft information gets sent from the demodulator to the inner decoder (which must change the information into useful probabilistic information). The code then gets sent to the de-interleaver, and from there to the outer decoder. This is exactly the reverse of the encoding process (outer encoder, interleaver, inner encoder). The outer decoder has two outputs: the soft information of the data bits and the soft information of the outer-encoded bits. The soft information of the outer-encoded bits gets sent back through the interleaver for the next iteration. The soft information of the data bits is not used until the final iteration, at which point the decoder makes a final decision on the decoded bits (in the decision block). The number of iterations is based on either some fixed number of iterations defined by the user or some stopping criteria (such as having identical data bit streams two iterations in a row at the decision block). Both the interleaver and de-interleaver involve operations that re-order the bit information and nothing mote. Algorithms used in the inner decoder and outer decoder blocks will now be discussed.

Two major classes of algorithms exist for iteratively decoding turbo codes. The first is the maximum a-posteriori (MAP) algorithm class, and the other is the Viterbi algorithm class (soft output Viterbi algorithm (SOVA) is the main algorithm in this class). Experiments with the SOVA algorithm performed by the assignee of the present invention yielded very poor performance results, so attention was focused on the MAP algorithm class.

MAP Algorithm

The MAP algorithm gives the best known BER performance for decoding turbo codes. It has three steps in both the inner decoder and outer decoder blocks. These include calculation of a forward recursion metric, calculation of a backward recursion metric, and using the forward and backward recursion metrics, updating the probabilistic information to output to the next stage.

The inner decoder calculates and outputs the soft information relating to the input to the inner encoder, while the outer decoder outputs soft information for both the input bits as well as the output bits of the outer encoder (the information on output of the outer encoder is fed back through the interleaver for the next iteration, while the information on the input contains the information on the data bits, so this feeds into the decision block).

The inner decoder and outer decoder also vary slightly in their inputs for SCCC's. For the inner decoder, both the data from the demodulator, converted into probabilities, as well as the feedback data from the outer decoder (after being sent through the interleaver) serve as inputs. The data from the demodulator provides information about the output of the inner encoder while the feedback data provides information about the input to the inner encoder. These two can be used together to refine the bit information. The outer decoder only has one input.

Figure 5:
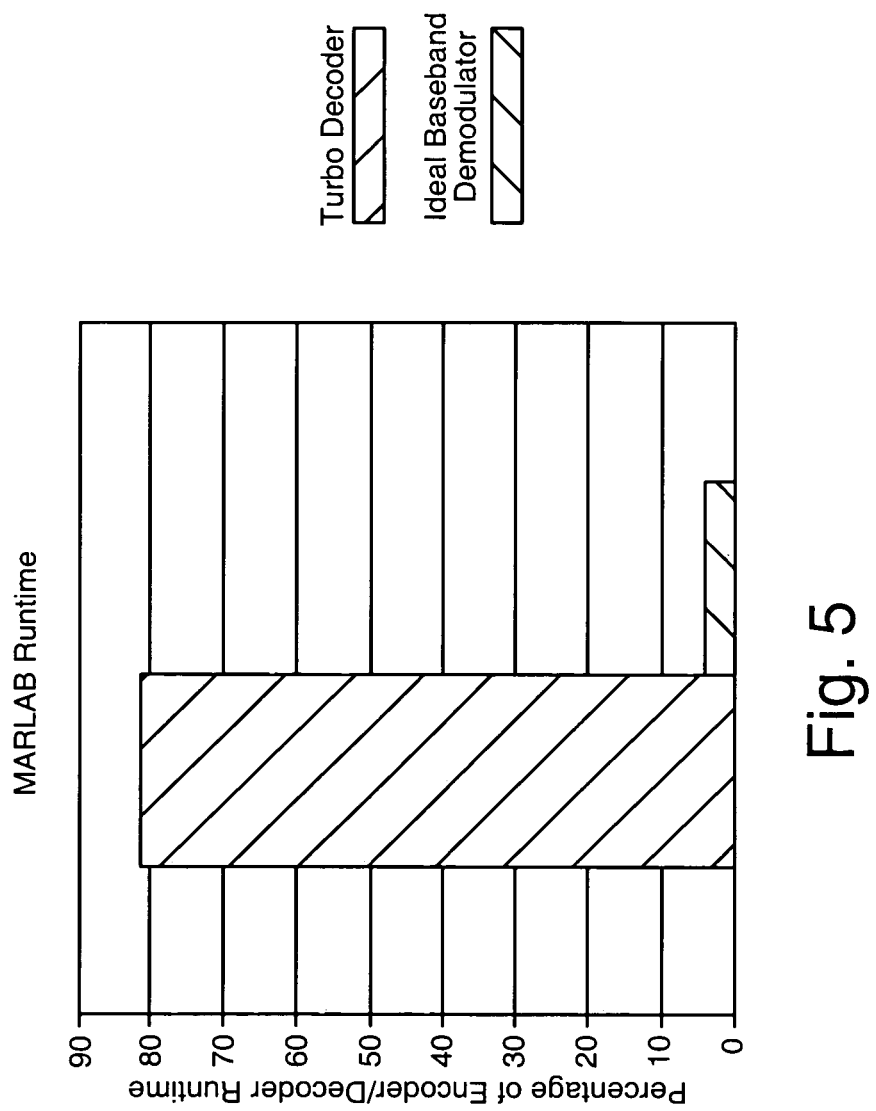
FIG. 5 is a bar graph showing percentage of encoder/decoder runtime for a ideal baseband demodulator and a turbo decoder.

In order to calculate the forward and backward recursion metrics, as well as updating the probabilistic information, many multiplication operations are performed, which is quite time-consuming, since multiplication operations take much more time to perform than addition operations. The decoders operate on encoded packets, so the number of forward and backward recursion metrics that must be calculated as well as the number of calculations required for the update of the probabilities are on the order of the number of bits in a data packet per iteration. This is the reason turbo decoding took up such a substantial portion of processing time (as illustrated in the bar graph shown in FIG. 5). For this reason, the MAP algorithm is rarely used in practice. Discussed below is an algorithm that is more useful.

Log-Max-MAP Algorithm

While the MAP algorithm has the best BER performance of all known algorithms, the number of multiplies per iteration make it impractical for fast performance in real-time systems. A Log-Max-MAP algorithm avoids some of the drawbacks of the MAP algorithm, using add and compare operations instead of multiply operations. The Log-Max-MAP algorithm accomplishes this by operating on logarithms of the probabilities as opposed to the probabilities themselves. With some initial log and exponent operations at the beginning of each decoder block (which can be implemented using look-up tables), all the multiply operations in the MAP algorithm may be turned into add operations. The add operations in the MAP algorithm can then be approximated using a max operation between the logarithms (this is where performance loss occurs in the Log-Max-MAP algorithm compared to the MAP algorithm). The soft information passed between the blocks takes the form of log-likelihood ratios. Details regarding this algorithm may be found in a book discussing turbo codes, such as M. Reza Soleymani, et al., *Turbo Coding for Satellite and Wireless Communications*. Kluwer Academic Publishers, 2002, or the Benedetto et al. paper cited above.

While providing computational advantages over the MAP algorithm, the Log-Max-MAP algorithm still has its problems. It still has to do time-consuming exponent and log operations at the beginning of each decoder block. Also, there is no clear normalization method to keep the recursive metrics from going out of bounds. It is known how to normalize to keep everything in bounds, but this is time-consuming, requiring log and exponent operators for each normalization, similar to MAP. In the MAP algorithm, this normalization is simple, as the recursive metrics are kept as probabilities (so they sum to 1). In the Log-Max-MAP algorithm, however, when dealing with log-likelihood ratios, how to efficiently normalize is not as clear (performing the same normalization as in the MAP algorithm would require a log and exponent operation for each normalization). In addition, for codes that are not rate one, it is not clear how to differentiate adjacent bits produced by a single input in the trellis for the outer code. These concerns are addressed in an optimized version of the design, improving both performance and speed.

Optimized Log-Max-MAP Algorithm for SCCC Decoding

The present decoder 10 implements three optimizations over the Log-Max-MAP algorithm. The decoder 10 comprises simple sum and compare operations, which can be done very quickly in hardware. This has no performance loss, though the amount of memory required may need to be increased (the number of values required doubles, but the quantization required per value is decreased). In addition, the BER performance of the decoder 10 is enhanced using the last step of the algorithm disclosed herein with minimal increases in computation complexity over typical Log-Max-MAP algorithms. A novel, computationally simple normalization step is also introduced in the decoder 10. The inner and outer decoder block designs comprising the decoder 10 are shown in FIGS. 3 and 4.

FIG. 3 shows details of the inner decoder 11 used in the decoder 10. As is shown in FIG. 3, soft demodulator data is input to a data converter 12 which converts the soft demodulator data into data corresponding to a log of probabilities. The log of probabilities data output by the data converter 12 are input to an inner decoder 14. The inner decoder 14 comprises a forward recursion metric 15 including normalization 15a and a backward recursion metric 16 including normalization 16a. The log of probabilities data is processed in parallel by the forward and backward recursion metrics 15, 16. Outputs of the forward and backward recursion metrics 15, 16 are coupled to and processed using soft log-likelihood calculations 17. The output of the soft log-likelihood calculations 17 comprises inner decoded soft data.

FIG. 4 shows details of the outer decoder 22 used in the decoder 10. As is shown in FIG. 4, the inner decoded soft data output by the soft log-likelihood calculations 17 of the inner decoder 11 is processed by a de-interleaver 21 and input to an outer decoder 22. The outer decoder 22 comprises a forward recursion metric 23 including normalization 23a and a backward recursion metric 24 including normalization 24a. Outputs of the forward and backward recursion metrics 23, 24 are coupled to and processed using soft log-likelihood calculations 25. The output of the soft log-likelihood calculations 17 comprises outer decoded soft data. The outer decoded soft data is processed by a decision block which produces decoded data bits. The outer decoded soft data is also fed back 13 (FIG. 3) to the inner decoder 14.

One improvement implemented in the decoder 10 is to use the log of the probabilities as opposed to log-likelihood ratios. That is, for each bit, to pass the values $\log(p(0))$ and $\log(p(1))$ as opposed to $\log(p(1)/p(0))$. By doing this, conventional look-up tables at the beginning of the inner and outer decoders 11, 22 are avoided. The drawback in this, however, is the number of values that are passed back and forth are doubled. There is some compensation here, however. While the number of values is doubled, the quantization to achieve equal performance is decreased, since two values are used to represent the data instead of one. In FIG. 3, the data converter 12 serves to transform raw demodulation data into log of probabilities data.

Another improvement provided by the decoder 10 is in the normalization methods 15a, 16a used in the forward and backward recursion metrics 15, 16. The decoder 10 implements this by normalizing the largest state recursion metric to 0, and subtracting off the original largest value from the rest of the recursion metrics. Mathematically, for a state recursion metric on a code requiring 4 states, define the values obtained at time k as $A_k(1)$, $A_k(2)$, $A_k(3)$, and $A_k(4)$. Then, define the max of these 4 values as $A_k^{max}=\max(A_k(1), A_k(2), A_k(3), A_k(4))$. The normalized values at each time k are then $A_k'(i)=A_k(i)-A_k^{max}$, $i=1 \ldots 4$. By doing this at each step, normalization is simplified to a quick compare and subtraction operation, without having any fear of going out of bounds. This results in all of the maximum values at each step of the recursion metric to be 0. Since the normalization affects all bits equally, there is no loss of performance using this method.

Another improvement provided by the decoder 10 is in its final stage, which improves performance using a simple compare operator. Normally, the output is calculated using the previous state metrics and the log of the probabilities. However, when the rate of the code is not 1 (for example, as in the outer code for the XDR+ waveform), the result is that bits corresponding to the same output symbol have the same probabilistic information. This can be further refined using an extension of the MAP algorithm discussed by Benedetto et al., and the same approximation may be used that allows compare operators in the Log-Max-MAP algorithm instead of add operators in the MAP algorithm. Thus, for an output symbol $c_k$, the likelihood value of each bit $c_k^i$ is given by taking the max over the sum of all the combinations of likelihood output symbols and likelihood input bits that correspond to the bit $c_k^i$. With these three innovations, the algorithm employed in the decoder 10 has better BER performance than a traditional Log-Max-MAP algorithm while also reducing complexity and increasing speed.

Thus, a fast, efficient architecture for inner and outer decoders for decoding serially concatenated convolutional codes has been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A serially concatenated convolutional code decoder comprising:

a data converter for processing soft demodulator data derived from a demodulator to generate log of probabilities data;

an inner decoder comprising a forward recursion metric in parallel with a backward recursion metric that process the log of probabilities data received from the data converter and are coupled to a soft log-likelihood calculation processor that generates inner decoded soft data;

a de-interleaver that de-interleaves the inner decoded soft data;

an outer decoder comprising a forward recursion metric in parallel with a backward recursion metric that are coupled to a soft log-likelihood calculation processor that processes de-interleaved inner decoded soft data to generate outer decoded soft data;

an interleaver for feeding back the outer decoded soft data to the inner decoder; and a decision processor for processing the outer-coded soft data to generate decoded data.

2. The decoder recited in claim 1 wherein the inner and outer decoders each normalize the largest state recursion metric to 0, and subtract off the original largest value from the rest of the recursion metrics.

3. The decoder recited in claim 1 wherein the soft log-likelihood calculation processor in the inner and outer decoders comprises only add and compare operators.

4. The decoder recited in claim 1 wherein the inner and outer decoders comprise only sum and compare operations.

5. The decoder recited in claim 1, wherein the forward recursion metric and the backward recursion metric of the inner decoder operate in parallel.

6. Apparatus for use with a serially concatenated convolutional code decoder comprising:
an inner decoder comprising a forward recursion metric in parallel with a backward recursion metric that are coupled to a soft log-likelihood calculation processor that generate inner decoded soft data; and
an outer decoder comprising a forward recursion metric in parallel with a backward recursion metric that are coupled to a soft log-likelihood calculation processor that generate outer decoded soft data, which outer decoded soft data is fed back to the inner decoder,
wherein the inner decoder receives processes log of probabilities data to generate the inner decoded soft data.

7. The apparatus recited in claim 6 wherein the inner and outer decoders each normalize the largest state recursion metric to 0, and subtract off the original largest value from the rest of the recursion metrics.

8. The apparatus recited in claim 6 wherein the soft log-likelihood calculation processor in the inner and outer decoders comprises only add and compare operators.

9. The apparatus recited in claim 6 wherein the inner and outer decoders comprise only sum and compare operations.

10. A serially concatenated convolutional code decoder comprising:
a data converter comprising look-up tables to process log and exponent operations for processing soft demodulator data derived from a demodulator to generate log of probabilities data;
an inner decoder comprising only add and compare operations that iteratively process the log of probabilities data to generate inner decoded soft data;
a de-interleaver that de-interleaves the inner decoded soft data;
an outer decoder comprising only add and compare operations that iteratively process the inner decoded soft data to generate outer decoded soft data;
an interleaver for feeding back the outer decoded soft data to the inner decoder; and
a decision processor for processing the outer-coded soft data to generate decoded data.

11. The decoder recited in claim 10 wherein:
the inner decoder comprises a forward recursion metric in parallel with a backward recursion metric that are coupled to a soft log-likelihood calculation processor that generate the inner decoded soft data; and
the outer decoder comprises a forward recursion metric in parallel with a backward recursion metric that are coupled to a soft log-likelihood calculation processor that generate the outer decoded soft data.

12. The decoder recited in claim 10 wherein the log of probabilities data generated by the data converter comprises $\log(p(0))$ and $\log(p(1))$ values for each bit of the soft demodulator data, log corresponding to a logarithmic function, $p(0)$ correspond to a probability of a 0, and $p(1)$ corresponding to a probability of a 1.

13. The decoder recited in claim 10 wherein the inner and outer decoders normalize state recursion metrics.

14. The decoder recited in claim 10 wherein the inner and outer decoders normalize the largest state recursion metric to 0, and subtract the original largest value from the remaining recursion metrics.

15. The decoder recited in claim 10 wherein the outer decoder, for each output symbol, determines the likelihood value of a selected bit of the output symbol by determining the maximum value over a sum of all combinations of likelihood output symbols and likelihood input bits that correspond to the selected bit.

16. The apparatus recited in claim 5, wherein the forward recursion metric and the backward recursion metric of the outer decoder operate in parallel.

* * * * *